(12) United States Patent
Katsui et al.

(10) Patent No.: US 11,996,042 B2
(45) Date of Patent: May 28, 2024

(54) METHOD OF COMPENSATING BRIGHTNESS OF DISPLAY AND DISPLAY

(71) Applicants: JSR CORPORATION, Tokyo (JP); Mattrix Technologies, Inc, Gainesville, FL (US)

(72) Inventors: Hiromitsu Katsui, Yokkaichi (JP); Bo Liu, Gainesville, FL (US); Maxime Lemaitre, Gainesville, FL (US)

(73) Assignees: MATTRIX TECHNOLOGIES, INC., Gainesville, FL (US); JSR CORPORATION, Tokyo (JP)

( * ) Notice: Subject to any disclaimer, the term of this patent is extended or adjusted under 35 U.S.C. 154(b) by 0 days.

(21) Appl. No.: 17/606,660

(22) PCT Filed: Apr. 23, 2020

(86) PCT No.: PCT/JP2020/017499
§ 371 (c)(1),
(2) Date: Oct. 26, 2021

(87) PCT Pub. No.: WO2020/218421
PCT Pub. Date: Oct. 29, 2020

(65) Prior Publication Data
US 2022/0215801 A1     Jul. 7, 2022

Related U.S. Application Data

(60) Provisional application No. 63/004,046, filed on Apr. 2, 2020.

(30) Foreign Application Priority Data

Apr. 26, 2019   (JP) .................................. 2019-086406

(51) Int. Cl.
| | | |
|---|---|---|
| G09G 3/3233 | (2016.01) | |
| G09G 3/3258 | (2016.01) | |
| G09G 3/3283 | (2016.01) | |
| G09G 3/3291 | (2016.01) | |
| H10K 50/30 | (2023.01) | |

(52) U.S. Cl.
CPC ......... *G09G 3/3233* (2013.01); *G09G 3/3258* (2013.01); *G09G 3/3283* (2013.01);
(Continued)

(58) Field of Classification Search
CPC .. G09G 3/3233; G09G 3/3258; G09G 3/3283; G09G 3/3291; G09G 2310/0262;
(Continued)

(56) References Cited

U.S. PATENT DOCUMENTS

| | | | |
|---|---|---|---|
| 2003/0090446 A1 | 5/2003 | Tagawa et al. | |
| 2006/0145144 A1* | 7/2006 | Lee ...................... | H10K 10/491 |
| | | | 257/40 |

(Continued)

FOREIGN PATENT DOCUMENTS

| | | |
|---|---|---|
| CN | 103460424 A | 12/2013 |
| CN | 105453164 A | 3/2016 |

(Continued)

OTHER PUBLICATIONS

International search report and written opinion of the international searching authority of PCT/JP2020/017499 dated Jul. 7, 2020.

(Continued)

*Primary Examiner* — Tom V Sheng
(74) *Attorney, Agent, or Firm* — Thomas | Horstemeyer, LLP

(57) ABSTRACT

Various examples are provided related to compensating brightness of a display using a vertical organic light emitting transistor that suppresses variations in brightness over a long period of time and a display. In one example, a method includes applying a voltage for brightness inspection to a gate electrode of the vertical organic light emitting transistor to be corrected, measuring a current flowing through a current supply line through which the current is supplied to a source electrode of the vertical organic light emitting (Continued)

transistor by the application of the voltage for brightness inspection to the gate electrode of the vertical organic light emitting transistor to be corrected, and determining a corrected value of the voltage to be applied to the gate electrode of the vertical organic light emitting transistor based on a value of the current and characteristic information of the vertical organic light emitting transistor stored in the memory.

13 Claims, 5 Drawing Sheets

(52) U.S. Cl.
CPC ... *G09G 3/3291* (2013.01); *G09G 2310/0262* (2013.01); *G09G 2320/0214* (2013.01); *G09G 2320/0233* (2013.01); *G09G 2320/0257* (2013.01); *G09G 2320/0295* (2013.01); *G09G 2320/045* (2013.01); *G09G 2320/0626* (2013.01); *G09G 2330/026* (2013.01); *H10K 50/30* (2023.02)

(58) Field of Classification Search
CPC ... G09G 2320/0214; G09G 2320/0233; G09G 2320/0257; G09G 2320/0295; G09G 2320/045; G09G 2320/0626; G09G 2330/026; H10K 50/30
USPC .......................................................... 345/690
See application file for complete search history.

(56) References Cited

U.S. PATENT DOCUMENTS

| | | | |
|---|---|---|---|
| 2012/0256175 A1* | 10/2012 | Rinzler | ................ H10K 10/484 257/40 |
| 2013/0240842 A1* | 9/2013 | Rinzler | ................ H10K 59/125 257/329 |
| 2014/0203249 A1* | 7/2014 | Lee | ...................... H10K 10/491 257/40 |
| 2015/0269887 A1 | 9/2015 | Liu et al. | |
| 2015/0279269 A1 | 10/2015 | Ishii et al. | |
| 2017/0110691 A1* | 4/2017 | Lee | ........................ H10K 50/30 |
| 2017/0250238 A1* | 8/2017 | Muccini | ............. H10K 59/1213 |
| 2019/0035335 A1* | 1/2019 | Kim | ..................... G09G 3/3258 |
| 2022/0215800 A1* | 7/2022 | Katsui | .................... H10K 59/12 |

FOREIGN PATENT DOCUMENTS

| | | | |
|---|---|---|---|
| JP | 2002278513 A | | 9/2002 |
| JP | 2003150107 A | | 5/2003 |
| JP | 2008151991 A | | 7/2008 |
| JP | 2008165159 A | | 7/2008 |
| JP | 2014505324 A | | 2/2014 |
| JP | 2015187641 A | | 10/2015 |
| KR | 20130130011 A | | 11/2013 |
| WO | 2009036071 A2 | | 3/2009 |

OTHER PUBLICATIONS

Office Action received for JP Patent Application No. 2019-086406, dated Dec. 2, 2022.
Decision of Refusal received for JP Patent Application No. 2019-086406, dated Mar. 5, 2023.
First Office Action for CN 202080028516.0 dated Oct. 24, 2023.
Office Action for TW 109113876 dated Sep. 21, 2023.
Request for Submission of an Opinion for KR 10-2021-7034737 mailed Jan. 31, 2024.
Second Office Action for CN 202080028516.0 mailed Feb. 8, 2024.
Office Action for JP 2019-086406 mailed Mar. 22, 2024.

* cited by examiner

[Fig. 1]
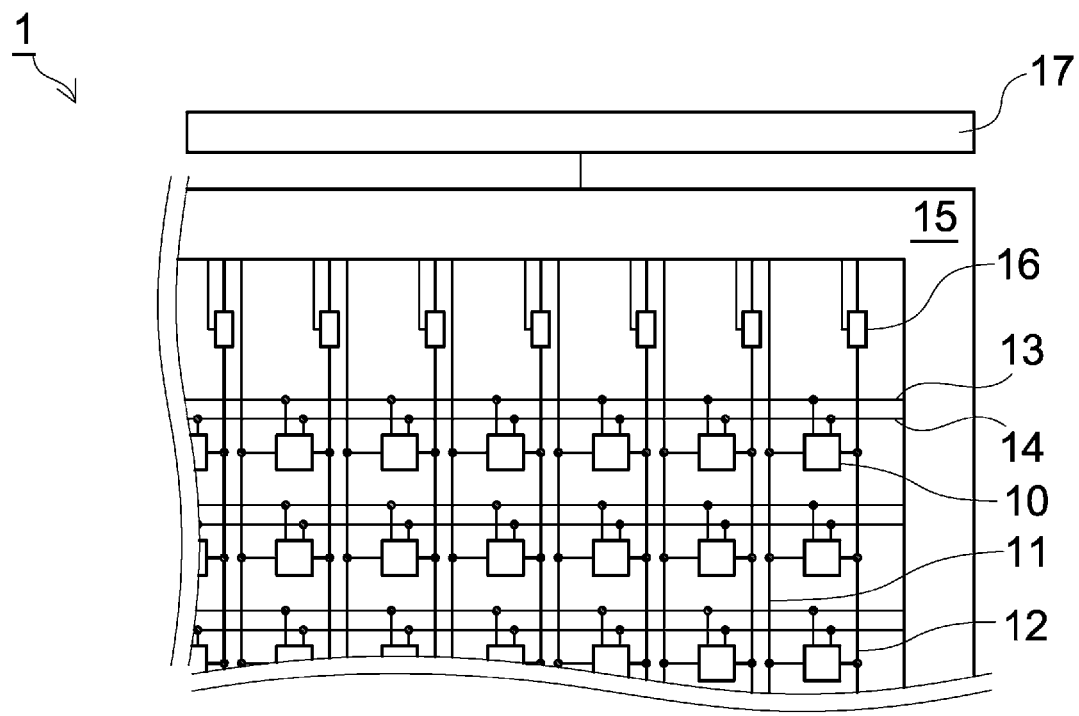
[Fig. 2]
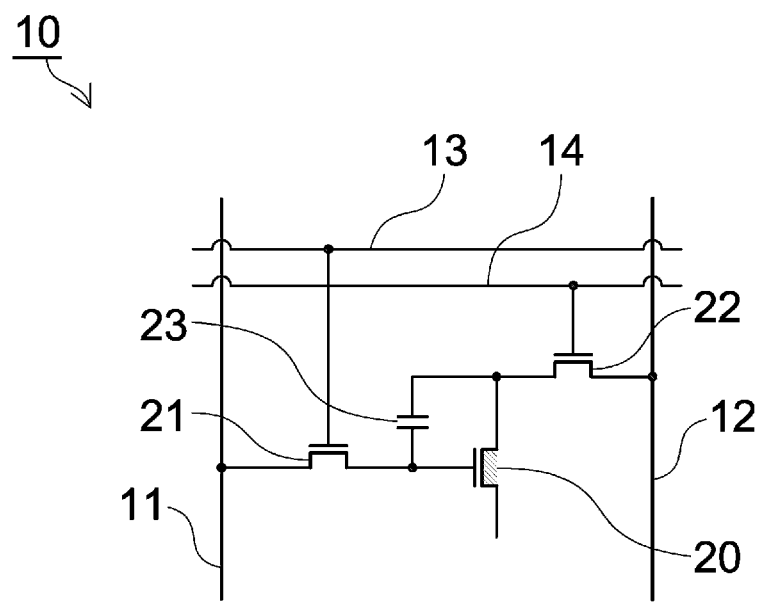

[Fig. 3]
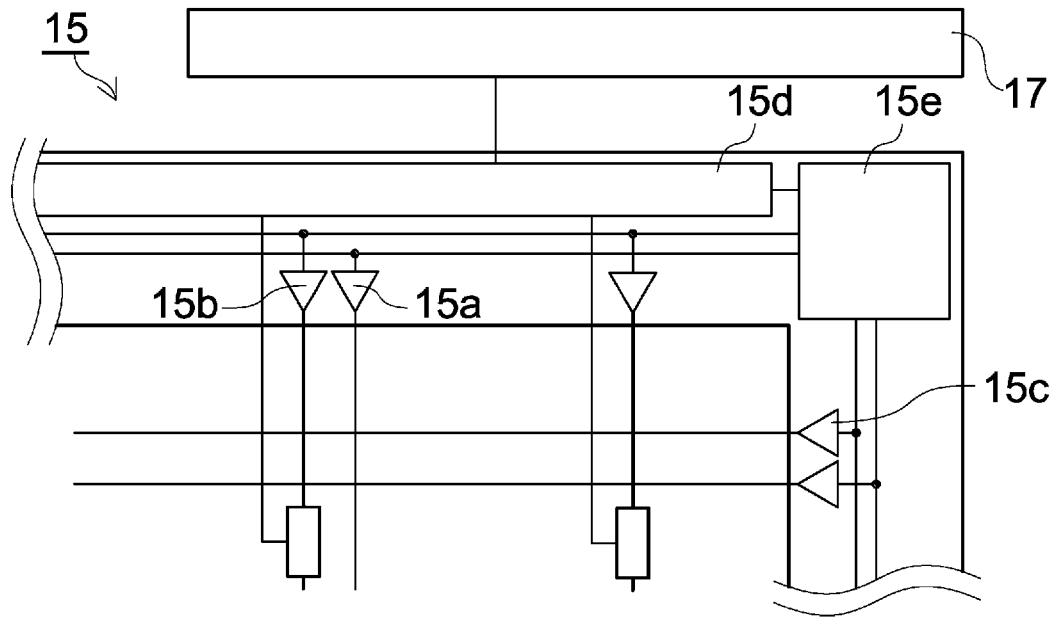
[Fig. 4]
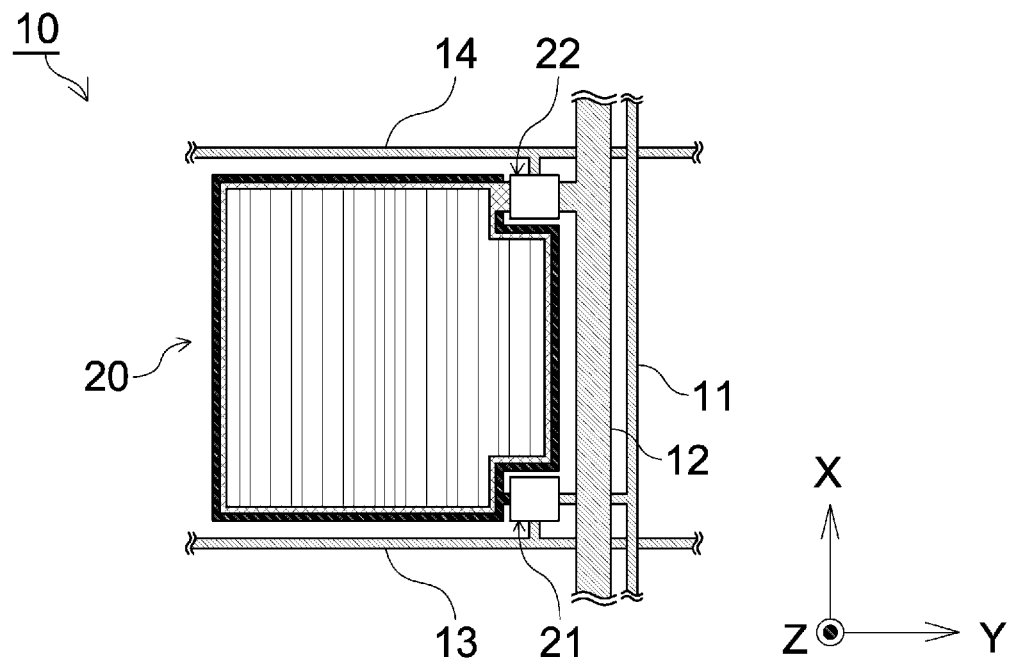

[Fig. 6]
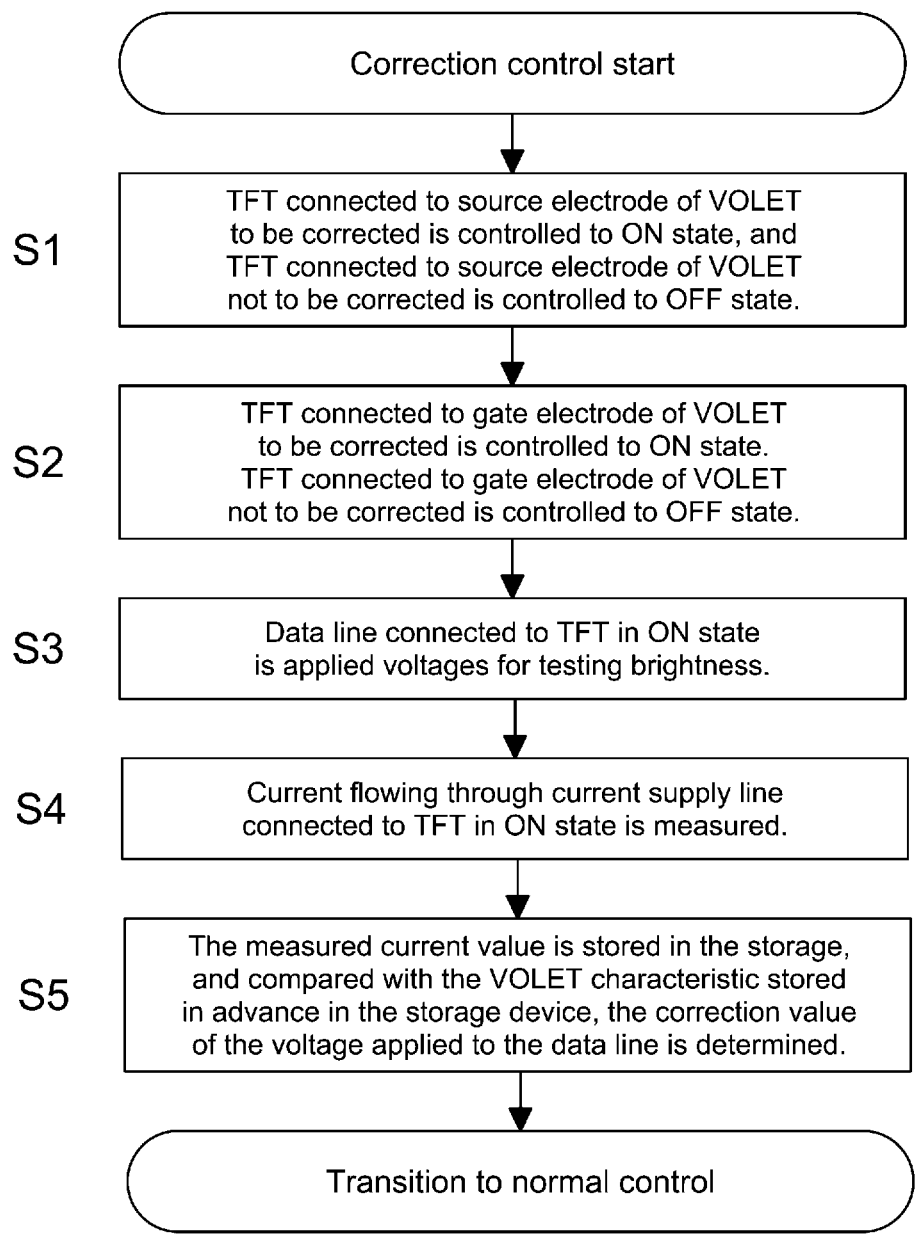

[Fig. 7]
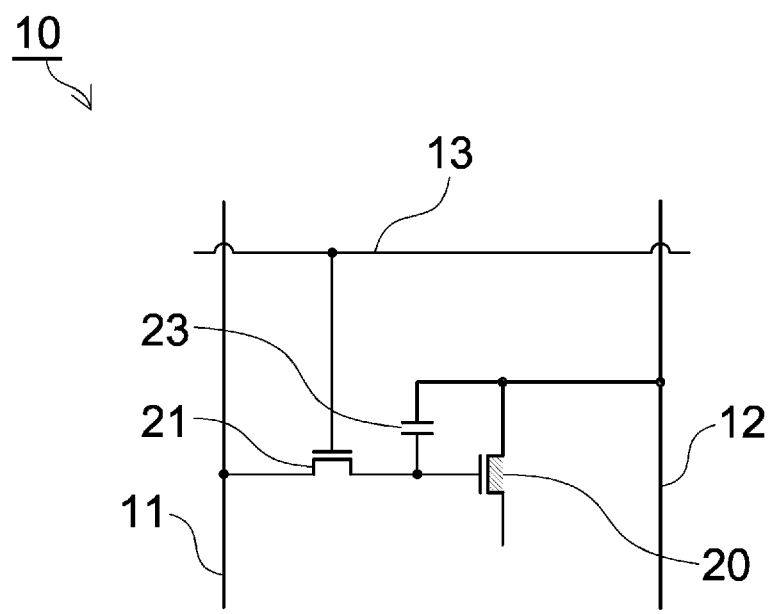

METHOD OF COMPENSATING BRIGHTNESS OF DISPLAY AND DISPLAY

CROSS-REFERENCE TO RELATED APPLICATIONS

This application is a national stage entry pursuant to 35 U.S.C. § 371 of Patent Cooperation Treaty (PCT) international application No. PCT/JP2020/017499, filed on Apr. 23, 2020, which claims priority to, and the benefit of the filing date of, U.S. provisional application No. 63/004,046, filed on Apr. 2, 2020, and JP patent application No. 2019-086406, filed on Apr. 26, 2019, which are all hereby incorporated by reference in their entireties.

TECHNICAL FIELD

The present invention relates to a method of driving and operating a light emitting display and a display.

BACKGROUND ART

In recent years, a display using an organic semiconductor element, such as an organic light emitting diode, as a light source element has been put into practical use, and is now commercially available. In the development of displays using the organic semiconductor element as the light source, in order to further improve performance, studies have been continuously made to achieve higher brightness, higher definition, lower power consumption, and longer life.

Conventionally, a light emitting element (also referred to as "pixel" and/or "subpixel") of an organic EL display is constituted of an organic light emitting diode (also referred to as "OLED") and a transistor that controls current flowing through the organic light emitting diode. The organic light emitting diode is a device that emits light in response to current input from a thin film transistor (also referred to as "TFT"), formed on a substrate rigid or flexible, to an organic EL layer sandwiched between an anode electrode and a cathode electrode.

However, for the above configuration, Patent Document 1 below describes a transistor that serves as an element for reducing the number of control elements and increasing a light emission area to achieve higher brightness and controls voltage applied to a gate electrode to adjust current flowing through the transistor, and describes a vertical organic light emitting transistor (also referred to as "VOLET") that emits light by itself according to the amount of current through the vertical organic light emitting transistor. Patent Document 2 below describes a display using a vertical organic light emitting transistor, and is expected to greatly increase the brightness of the display.
PTL 1: Patent Document 1: WO 2009/036071
PTL 2: Patent Document 2: JP-A-2014-505324

SUMMARY OF THE INVENTION

Similar to a field effect transistor, the vertical organic light emitting transistor includes a source electrode, a gate electrode, and a drain electrode. The source electrode corresponds to an anode electrode, and the drain electrode corresponds to a cathode electrode. An EL element and an organic semiconductor layer are formed between the source electrode and the drain electrode, and each electrode is configured to emit EL by passing current through the EL element and the organic semiconductor layer. At least one of the source electrode and the drain electrode is configured to be transparent so that light obtained by light emission is emitted to the outside.

It is known that when an organic light emitting diode used in a conventional configuration continues to be lit for a long period of time, the deterioration proceeds in proportion to the injected current and the brightness gradually decreases. Potential causes are the variation in interlayer injection efficiency due to a chemical change, charge accumulation to each organic layer interface, or the like in the organic light emitting diode. The same applies to a vertical organic light emitting transistor which emits EL by passing current through the EL element and the organic semiconductor layer sandwiched between the source electrode corresponding to the anode electrode and the drain electrode corresponding to the cathode electrode as described above.

However, through intensive studies the present inventors have found that depending on detailed device structures and materials used, a display using the vertical organic light emitting transistor may suffer from the following problems. When the vertical organic light emitting transistor applies voltage to the gate electrode in order to emit EL by passing current through the EL element and the organic semiconductor layer, charge accumulates at an interface between the gate electrode and a gate insulating film layer, at an interface between the source electrode, and the organic semiconductor layer and a surface layer, etc., and at each of the gate insulating film layer and the surface layer. When charge accumulates at these interfaces, a phenomenon occurs in which even if the vertical organic light emitting transistor applies a predetermined voltage to the gate electrode, charge equivalent to that in a state where the transistor has just been manufactured or at the time of factory shipment is not injected to the EL element and the organic semiconductor layer, so that the brightness decreases more rapidly than the organic light emitting diode. Thus, the display using the vertical organic light emitting transistor tends to cause characteristic fluctuations in a short period of time and tends to have a short life, so that reliability as a product becomes a problem.

Even if the current flowing through the vertical organic light emitting transistor changes, it is possible to configure a circuit that performs feedback control so that a desired current flows. However, this adds a complicated circuit configuration, so that a region for element placement is required. That is, a light emitting region becomes small, and achievement of higher brightness is hindered.

In view of the above problems, an object of the present invention is to provide a method of compensating brightness of a display using a vertical organic light emitting transistor that suppresses variation in brightness over a long period of time without adding a complicated circuit configuration and a display.

A method of compensating brightness of a display according to the present invention is a method of compensating brightness of a display including a plurality of vertical organic light emitting transistors and a memory that stores characteristic information of the vertical organic light emitting transistor.

This method includes a step (A) of applying a voltage for brightness inspection to a gate electrode of the vertical organic light emitting transistor to be corrected, a step (B) of measuring a current flowing through a current supply line through which the current is supplied to a source electrode of the vertical organic light emitting transistor by the application of the voltage for brightness inspection to the gate electrode of the vertical organic light emitting transistor to be corrected, and a step (C) of determining a corrected value of a voltage to be applied to the gate electrode of the vertical organic light emitting transistor based on a value of the current measured in the step (B) and the characteristic information of the vertical organic light emitting transistor stored in the memory.

The memory stores the characteristic information of the vertical organic light emitting transistor at the time when the display is just manufactured or at the time of factory shipment. Here, the characteristic information of the vertical organic light emitting transistor includes, for example, electron mobility ($\mu$), conductance (gm=Id/Vg), threshold voltage (Vt), lookup table of the luminance-voltage and/or current-voltage characteristics, and the like. As Id, a current value flowing between the source electrode and a drain electrode of the vertical organic light emitting transistor is represented, and as Vg, a voltage applied to the gate electrode of the vertical organic light emitting transistor is represented.

As described above, the current value of the current flowing through the current supply line or each vertical organic light emitting transistor is confirmed, and in each vertical organic light emitting transistor, a voltage applied to the gate electrode is corrected based on the characteristic information stored in the memory such that the current flows with a desired current value. That is, a current supplied to an organic semiconductor layer of the vertical organic light emitting transistor over a long period is adjusted so as to have a desired current value. Accordingly, variation in brightness due to deterioration of the vertical organic light emitting transistor itself, and/or the OLED stack is suppressed, and the brightness is compensated for a long time.

The current value may be measured individually for each vertical organic light emitting transistor, or may be collectively measured for the vertical organic light emitting transistors arranged in a specific region or on the same line. When the current value of the current flowing through the source electrode of each vertical organic light emitting transistor is measured and the voltage applied to the gate electrode is adjusted, the current flowing through the source electrode can be accurately corrected to obtain desired brightness.

However, since a display with a large number of pixels is constituted of millions to tens of millions of vertical organic light emitting transistors, it takes a long time to correct all the vertical organic light emitting transistors when the vertical organic light emitting transistors are individually corrected. Thus, there is a difference in brightness between a portion where the voltage applied to the gate electrode is corrected and a portion where the correction is not performed, and image quality is likely to be uneven. Accordingly, it is preferable that the correction be collectively performed in a short time for the vertical organic light emitting transistors arranged in a specific region or on the same line.

The step (A) of the brightness compensation method may include a step (A1) of cutting off current supply to the vertical organic light emitting transistor not to be corrected.

When the step (A) and the step (B) are performed, not a voltage corresponding to an image to be displayed but the voltage for brightness inspection is applied to the gate electrode of the vertical organic light emitting transistor, so that an unintended display is displayed on a screen for a moment. At this time, if a bright screen is displayed instantaneously, a person watching the display tends to feel flickering of the screen and the like. Thus, it is preferable to use a screen that is as dark as possible.

By adopting the above method, it is possible to cut off a path serving as a supply source of the current flowing through the vertical organic light emitting transistor, perform the correction step on a darker screen, and measure the current more accurately.

The step (A) and the step (B) of the brightness compensation method are performed during an image update interval.

The characteristics of the vertical organic light emitting transistor are easily affected by temperature, and during operation where temperature is higher than that when a power is turned on, the value of the flowing current is different even when the same voltage is applied to the gate electrode of the vertical organic light emitting transistor. Therefore, it is necessary to measure and correct the current value at the temperature during the operation.

By adopting the above method, while the display starts the operation and temperature rises and in a state where the temperature rises to the operating temperature, the voltage applied to the gate electrode of the vertical organic light emitting transistor is corrected so that desired brightness can be achieved, as a result, light emission having desired brightness after correction can be performed. After the power is turned on, the correction value is determined by a single current measurement, and an offset voltage of each vertical organic light emitting transistor is obtained and stored, and control may be performed so as to offset the voltage applied to the gate electrode of the vertical organic light emitting transistor according to the passage of time and temperature.

In a liquid crystal display or a display, a screen different from an image displayed during an update interval of an image to be displayed is inserted for a moment, so that there is provided such an effect that afterimages can be reduced when a previous image is switched to the next image.

The step (B) of the brightness compensation method may include a step (B1) of storing the current value, measured in the step (B), in the memory.

By adopting the above method, it is possible to perform correction such that not only initial characteristic information of each vertical organic light emitting transistor stored in the memory, but also a difference with respect to the current value measured in the previous step and a corrected voltage value, etc. is adjusted. Thus, the current value to the source electrode of the vertical organic light emitting transistor is not measured even immediately after the power is turned on, and images and movies can be displayed in a state where correction is performed based on a current value at the time of the last correction.

The display of the present invention includes:
- a plurality of vertical organic light emitting transistors arranged in an array;
- a data line that supplies a voltage for controlling a gate electrode of the plurality of vertical organic light emitting transistors;
- a current supply line that supplies a current to a source electrode of the plurality of vertical organic light emitting transistors;
- a first thin film transistor that is connected between the gate electrode of each of the vertical organic light emitting transistors and the data line and controls voltage supply to the gate electrode of the vertical organic light emitting transistor;
- a first gate line that is connected to a gate electrode of the first thin film transistor and controls the first thin film transistor;

a controller that controls a voltage applied to at least the first gate line;

a current measurement portion that measures a current flowing through the current supply line; and a memory that stores characteristic information of each of the vertical organic light emitting transistors.

The controller performs control such that a voltage for brightness inspection is applied to the gate electrode of the vertical organic light emitting transistor to be corrected, the current measurement portion measures a current flowing through the source electrode of the vertical organic light emitting transistor by the application of the voltage for brightness inspection to the gate electrode of the vertical organic light emitting transistor to be corrected, and stores a value of the measured current in the memory, and the controller determines a corrected value of the voltage to be applied to the gate electrode of the vertical organic light emitting transistor based on the measured current value and the characteristic information of the vertical organic light emitting transistor stored in the memory.

For example, the controller controls the voltage of the first gate line to turn on the first thin film transistor connected to the vertical organic light emitting transistor to be corrected, and, in this ON state, determines a corrected value of the voltage applied to the data line from a current value of the current supply line measured by the current measurement portion and the characteristic information of the vertical organic light emitting transistor stored in the memory. Consequently, the brightness of the vertical organic light emitting transistor to be corrected can be corrected.

According to the above configuration, it is possible to adjust the voltage applied to the data line in order to display a desired image. Consequently, the value of the current flowing through the vertical organic light emitting transistor is corrected, and a display in which the image quality and the brightness do not vary despite long-time use can be configured, and the brightness can be compensated for long-time lighting.

In the display, a dielectric layer may be formed between the gate electrode and the source electrode of the vertical organic light emitting transistor.

The image displayed on the display is updated by sequentially switching the ON/OFF state of the first thin film transistor connected to each vertical organic light emitting transistor and applying a desired voltage to the gate electrode of the vertical organic light emitting transistor according to each pixel. At this time, after the voltage application to the gate electrode of the vertical organic light emitting transistor is completed and the first thin film transistor is switched to the OFF state, the vertical organic light emitting transistor must maintain its brightness for a predetermined time. That is, in order to maintain the current flowing through the vertical organic light emitting transistor, it is necessary to maintain the voltage between the gate electrode and the source electrode of the vertical organic light emitting transistor.

For this purpose, an element such as a capacitor for maintaining charge must be connected between the gate electrode and the source electrode of the vertical organic light emitting transistor. If a capacitor configured as a semiconductor circuit is used to obtain a capacitance value for maintaining voltage, a very large element is required, and the light emitting region is compressed.

Thus, with the above configuration, a capacitor can be configured as a parasitic element in the vertical organic light emitting transistor formed to have a large size in order to increase the light emitting region. That is, it is not necessary to connect a capacitor for maintaining voltage separately, and the light emitting region is not compressed, so that a display with higher brightness can be configured.

In the vertical organic light emitting transistor of the display, the source electrode and/or the drain electrode may be formed of a conductive material containing carbon.

Furthermore, in the vertical organic light emitting transistor of the display, the source electrode and/or the drain electrode may be formed of a carbon nanotube (also referred to as "CNT").

The conductive material containing carbon, particularly a carbon nanotube, has high capacity to carry high current density and can form a conductive film transparent to visible light. Accordingly, by using materials as described above, it is possible to configure a vertical organic light emitting transistor that is transparent to visible light and can flow a large current. Since the carbon nanotube has high mechanical strength and is flexible, a flexible display can also be configured.

The above display further includes a second thin film transistor that is connected between the source electrode of the vertical organic light emitting transistor and the current supply line and controls current supply to the source electrode of the vertical organic light emitting transistor and a second gate line that is connected to a gate electrode of the second thin film transistor and controls the second thin film transistor. The controller may perform control such that the second thin film transistor connected to the vertical organic light emitting transistor not to be corrected is in an OFF state.

Furthermore, the second thin film transistor of the display may be formed of an oxide semiconductor.

During normal operation, the second thin film transistor in the ON state is switched to the OFF state, whereby the supply path of the current flowing through the vertical organic light emitting transistor can be cut off. Furthermore, when the second thin film transistor is formed of an oxide semiconductor that has a small amount of current (leakage current) that flows even in the OFF state, the current flowing through the vertical organic light emitting transistor not to be corrected can be further reduced.

The present invention achieves a method of compensating brightness of a display using a vertical organic light emitting transistor that suppresses variation in brightness over a long period of time without adding a complicated circuit configuration and a display.

BRIEF DESCRIPTION OF DRAWINGS

FIG. 1 is a schematic configuration diagram of a portion of an embodiment of a display;

FIG. 2 is a circuit diagram of a light emitting unit in FIG. 1;

FIG. 3 is a configuration diagram of a controller in FIG. 1;

FIG. 4 is a top view of a schematic element configuration of the light emitting unit configured on a substrate;

FIG. 6 is a flowchart showing a brightness correction procedure of the display; and FIG. 7 is a schematic configuration diagram of a portion of another embodiment of the display.

DETAILED DESCRIPTION OF THE PREFERRED EMBODIMENTS

Figure 5:
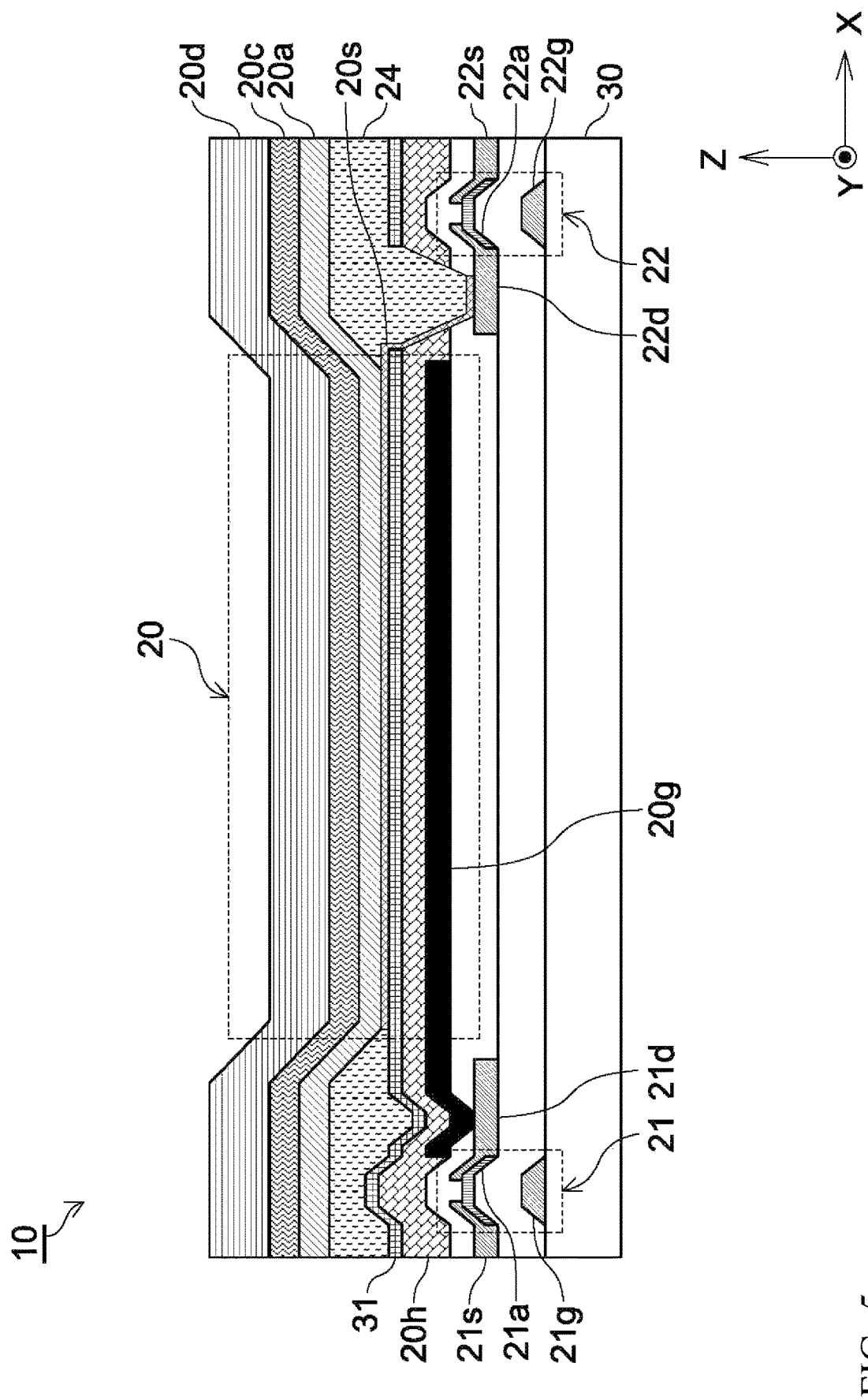
FIG. 5 is a side view of the light emitting unit in FIG. 4.

Hereinafter, the configuration of a display of the present invention will be described with reference to the drawings.

The following drawings are schematically illustrated, and the dimensional ratio and the number in the drawings do not necessarily coincide with the actual dimension ratio and the actual number.

Configuration

First, the configuration of the display will be described. FIG. 1 is a schematic configuration diagram of a portion of an embodiment of a display 1. As shown in FIG. 1, the display 1 of this embodiment includes a light emitting unit 10 including vertical organic light emitting transistors arranged in an array, a data line 11 that supplies voltage to a gate electrode of the vertical organic light emitting transistor, a current supply line 12 that supplies current to a source electrode of the vertical organic light emitting transistor, a first gate line 13 that controls a first thin film transistor, a second gate line 14 that controls a second thin film transistor, a controller 15, a current measurement portion 16 that measures current flowing through the current supply line 12, and a memory 17.

FIG. 2 is a circuit diagram of the light emitting unit 10 in FIG. 1. As shown in FIG. 2, the light emitting unit 10 includes a vertical organic light emitting transistor 20, a first thin film transistor 21 that controls voltage supply to the gate electrode of the vertical organic light emitting transistor 20, a second thin film transistor 22 that controls current supply to the source electrode of the vertical organic light emitting transistor 20, and a capacitor 23 connected between the source electrode and the gate electrode of the vertical organic light emitting transistor 20.

The data line 11 is wiring for applying voltage to the gate electrode of the vertical organic light emitting transistor 20 via the first thin film transistor 21 in order to adjust a light emission luminance of the vertical organic light emitting transistor 20 according to an image to be displayed. The current supply line 12 is wiring for supplying current to the source electrode of the vertical organic light emitting transistor 20 via the second thin film transistor 22.

The first gate line 13 is connected to the gate electrode of the first thin film transistor 21, and controls ON/OFF of the first thin film transistor 21, that is, controls energization between the gate electrode of the vertical organic light emitting transistor 20 and the data line 11. The second gate line 14 is connected to the gate electrode of the second thin film transistor 22, and controls ON/OFF of the second thin film transistor 22, that is, controls energization between the source electrode of the vertical organic light emitting transistor 20 and the current supply line 12.

The current measurement portion 16 is disposed to measure the total value of the current amount flowing to the light emitting unit 10 (vertical organic light emitting transistor 20) connected to the same current supply line 12.

FIG. 3 is a configuration diagram of the controller 15 in FIG. 1. As shown in FIG. 3, the controller 15 includes a plurality of gate drivers 15a for driving the data line 11, a plurality of source drivers 15b for driving the current supply line 12, a plurality of gate controllers 15c for controlling voltage of the first gate line 13 and voltage of the second gate line 14, a data input/output circuit 15d that receives a current value measured by the current measurement portion 16 and stores the current value in the memory 17, and an arithmetic processing circuit 15e that calculates a corrected value of a voltage applied to the gate electrode of the vertical organic light emitting transistor 20 from the current value measured by the current measurement portion 16 and characteristic information of the vertical organic light emitting transistor 20 stored in the memory 17. Details regarding the control will be described later in the item of control method.

The specific configuration of each block constituting the controller 15 is configured by a dedicated circuit, a processor controlled by a software program, or a combination thereof. For example, the dedicated circuit may be a dedicated integrated circuit (Application Specific Integrated Circuit, abbreviated as ASIC) or a programmable device (PLD, CPLD, FPGA). ASIC is configured to be electrically connected to a logic circuit, which generates a control signal configured on the substrate on which the vertical organic light emitting transistor 20 is configured, a driver circuit for driving each of the vertical organic light emitting transistors 20, or each line (11, 12, 13, 14). The programmable device can built the dedicated circuit by programming.

The processor may be a central processing unit (abbreviated as CPU), another general-purpose processor, a digital signal processor (abbreviated as DSP), an ASIC, or the like. The general-purpose processor may be a microprocessor, and the processor may be any standard processor or the like. Various processing steps may be executed directly by a hardware processor, or may be executed by a combination of hardware and software (or a software function module) in the processor. Furthermore, a control device such as a microcontroller may be used.

The memory 17 may include a high-speed RAM memory, and may be realized by any type of volatile or nonvolatile memory device or a combination thereof. Examples include static random access memory (SRAM), electrically erasable programming read only memory (EEPROM), erasable programming read only memory (EPROM), programming read only memory (PROM), read only memory (ROM), a magnetic memory, a flash memory, a magnetic disk and an optical disk.

The capacitor 23 is a voltage holding element which is disposed to maintain a displayed image for a predetermined time while the first thin film transistor 21 is in an OFF state, and holds a voltage between the gate electrode and the source electrode of the vertical organic light emitting transistor 20.

Next, the structure of each element formed on the substrate will be described. FIG. 4 is a top view of a schematic element configuration of the light emitting unit 10 configured on a substrate 30. FIG. 5 is a side view of the light emitting unit 10 in FIG. 4. As shown in FIGS. 4 and 5, the vertical organic light emitting transistor 20, the first thin film transistor 21, and the second thin film transistor 22 are formed in a region divided by the data line 11, the current supply line 12, the first gate line 13, and the second gate line 14.

The substrate 30 may be made of a glass material or a plastic material such as PET (Poly Ethylene Terephthalate), PEN (Poly Ethylene Naphthalate), or polyimide.

In the following description, a description will be given by assuming that a direction in which the data line 11 and the current supply line 12 are wired is an X direction, a direction in which the first gate line 13 and the second gate line 14 are wired is a Y direction, a direction orthogonal thereto is a Z direction, and a side toward a direction (+Z direction) away from the substrate 30 is an upper layer side.

In the configuration of the vertical organic light emitting transistor 20, a source electrode layer $20s$ is formed, and a gate electrode layer $20g$ is further formed below the source electrode layer $20s$ through a gate insulating film layer $20h$ formed of a dielectric. The source electrode layer $20s$ is configured to apply a carbon-containing conductive material (in this embodiment, carbon nanotubes) onto a drain electrode layer $20d$ corresponding to the cathode electrode, an organic EL layer $20c$, an organic semiconductor layer $20a$, and a surface of a surface layer 31 from the upper layer. When voltage is applied to the gate electrode layer 20g, a Schottky barrier between the organic semiconductor layer 20a and the source electrode layer 20s changes, and current flows from the source electrode layer 20s to the organic semiconductor layer 20a once a predetermined threshold value is exceeded, so that the vertical organic light emitting transistor 20 emits light.

In the display 1 of this embodiment, the substrate 30 is made of a material that is transparent to visible light, and the gate electrode layer 20g and the source electrode layer 20s are configured to have a gap through which visible light can pass, so that light emitted from the organic semiconductor layer 20a passes through the substrate 30 and is emitted to the outside, thereby displaying an image. As described above, the method of passing light through the substrate 30 and emitting the light is also referred to as "bottom emission method", and has advantages that wiring connection between electrodes is easy and manufacture is easy.

The first thin film transistor 21 and the second thin film transistor 22 are connected respectively to the source electrode layer (21s, 22s) and the drain electrode layer (21d, 22d) with the oxide semiconductor layer (21a, 22a) interposed therebetween, and the gate electrode layer (21g, 22g) is formed below the oxide semiconductor layer (21a, 22a) with an insulating layer or a dielectric layer interposed therebetween. When a voltage is applied to the gate electrode layer (21g, 22g), a channel is formed in the oxide semiconductor layer (21a, 22a), and the source electrode layer (21s, 22s) and the drain electrode layer (21d, 22d) are energized.

In the first thin film transistor 21, the source electrode layer 21s is connected to the data line 11, and the drain electrode layer 21d is connected to the gate electrode layer 20g of the vertical organic light emitting transistor 20. In the second thin film transistor 22, the source electrode layer 22s is connected to the current supply line 12, and the drain electrode layer 22d is connected to the source electrode layer 20s of the vertical organic light emitting transistor 20. In the first thin film transistor 21, the source electrode layer 21s may be connected to the gate electrode layer 20g of the vertical organic light emitting transistor 20, and the drain electrode layer 21d may be connected to the data line 11.

As shown in FIG. 4, the vertical organic light emitting transistor 20 is formed so that the light emitting region is as large as possible in order to achieve high brightness, and the first thin film transistor 21 and the second thin film transistor 22 are formed as small as possible at a corner of a segmented region so that the influence is small with respect to the light emitting region of the vertical organic light emitting transistor 20.

In FIGS. 4 and 5, the capacitor 23 is not illustrated, but as shown in FIG. 5, in the vertical organic light emitting transistor 20 of this embodiment, the source electrode layer 20s and the gate electrode layer 20g are arranged facing each other with the gate insulating film layer 20h interposed therebetween, so that the capacitor 23 is provided as a parasitic element. In such a capacitor 23 as a parasitic element, when a capacitance value is insufficient, another capacitor may be additionally formed.

Hereinafter, materials used for each layer will be exemplified.

Examples of the material of the drain electrode layer 20d of the vertical organic light emitting transistor 20 include single-layer or multilayer graphene, carbon nanotube, aluminum (Al), lithium fluoride (LiF), molybdenum oxide (MoXOY), indium tin oxide (ITO), and zinc oxide (ZnO).

Examples of the material of the gate electrode layer 20g of the vertical organic light emitting transistor 20 include zinc oxide (ZnO) doped with a metal such as aluminum (Al), tin (Sn), yttrium (Y), scandium (Sc), or gallium (Ga), metal-doped and undoped transparent conductive oxides such as indium oxide (In2O3), tin dioxide (SnO2), and cadmium oxide (CdO), and materials containing combinations thereof. Alternatively, aluminum (Al), gold (Au), silver (Ag), platinum (Pt), cadmium (Cd), nickel (Ni) and tantalum (Ta), and combinations thereof, as well as p- or n-doped silicon (Si) and gallium arsenide (GaAs) may be employed.

Examples of the material of the gate insulating film layer 20h between the surface layer 31 and the gate electrode layer 20g of the vertical organic light emitting transistor 20 include organic compounds such as silicon oxide (SiOX), aluminum oxide (Al2O3), silicon nitride (Si3N4), yttrium oxide (Y2O3), lead titanate (PbTiOX), aluminum titanate (AlTiOX), glass and parylene polymer, polystyrene, polyimide, polyvinylphenol, polymethyl methacrylate, and fluoropolymer.

Examples of the material of the organic semiconductor layer 20a of the vertical organic light emitting transistor 20 include linear condensed polycyclic aromatic compounds (or acene compounds) such as naphthalene, anthracene, rubrene, tetracene, pentacene, hexacene, and derivatives thereof, pigments such as copper phthalocyanine (CuPc) compounds, azo compounds, perylene compounds, and derivatives thereof, low molecular weight compounds such as hydrazone compounds, triphenylmethane compounds, diphenylmethane compounds, stilbene compounds, allyl vinyl compounds, pyrazoline compounds, triphenylamine derivatives (TPD), allylamine compounds, low molecular weight amine derivatives (a-NPD), 2,2',7,7'-tetrakis(diphenylamino)-9,9'-spirobifluorene (spiro-TAD), N,N'-di(1-naphthyl)-N,N'-diphenyl-4,4'-diamonobiphenyl (spiro-NPB), 4,4',4"-tris[N-3-methylphenyl-N-phenylamino]triphenylamine (mMTDATA), 2,2',7,7'-tetrakis(2,2-diphenylvinyl)-9,9-spirobifluorene (spiro-DPVBi), 4,4'-bis(2,2-diphenylvinyl)biphenyl (DPVBi), (8-quinolinolato) aluminum (Alq), tris(8-quinolinolato)aluminum (Alq3), tris(4-methyl-8quinolinolato)aluminum (Almq3), and derivatives thereof, polymer compounds such as for polythiophene, poly(p-phenylene vinylene) (PPV), biphenyl group-containing polymers, dialkoxy group-containing polymers, alkoxyphenyl PPV, phenyl PPV, phenyl/dialkoxy PPV copolymers, poly(2-methoxy-5-(2'-ethylhexyloxy)-1,4-phenylenevinylene) (MEH-PPV), poly(ethylenedioxythiophene) (PEDOT), poly(styrenesulfonic acid) (PSS), poly(aniline) (PAM), poly(N-vinylcarbazole), poly(vinylpyrene), poly(vinylanthracene), pyreneformaldehyde resin, ethylcarbazole formaldehyde halogenated resin, and modified compounds thereof, n-type transporting organic low molecules such as 5,5-diperfluorohexylcarbonyl-2,2_:_5_, 2_:5_,2_-quaterthiophene (DFHCO-4T), DFH-4T, DFCO-4T, P(NDI2OD-T2), PDI8-CN2, PDIF-CN2, F16CuPc, fullerene, naphthalene, perylene, and oligothiophene derivatives, oligomers, or polymer, as well as aromatic compounds having thiophene rings such as thieno[3,2-b]thiophene, dinaphthyl[2,3-b: 2',3'-f]thieno[3,2-b]thiophene (DNTT), and 2-decyl-7-phenyl[1]benzothieno[3,2-b][1]benzothiophene (BTBT).

Here, in the vertical organic light emitting transistor 20, an organic semiconductor with an appropriate energy level is suitably selected, so that a hole injection layer, a hole transport layer, an organic EL layer, an electron transport layer, an electron injection layer, and the like typically used in OLED displays can be favorably used. A color of light emitted to the outside is adjusted such that light of color such as red, green, and blue is emitted by selecting the material constituting the organic EL layer 20c. Furthermore, the vertical organic light emitting transistor 20 can be configured to emit white light, and in the pixel with the same vertical organic light emitting transistor 20 a color filter may be incorporated and used to select light of a desired color and thus to emit the light. Furthermore, the vertical organic light emitting transistor 20 can be configured to emit short wavelength light such as blue light, and in the pixel with the same vertical organic light emitting transistor 20 a layer consists of energy conversion materials such as quantum dots may be used to convert emitted light to desired wavelengths and thus to emit the light of desired color such as green and red.

The surface layer 31 is a layer formed on the gate insulating film layer 20h for the purpose of securing the source electrode layer 20s (particularly CNT layer). The surface layer 31 can be formed by applying a composition containing a binder resin formed from a silane coupling material, an acrylic resin, and the like.

Examples of the material of the oxide semiconductor layer (21a, 22a) configured by the first thin film transistor 21 and the second thin film transistor 22 include In—Ga—Zn—O-based semiconductors, Zn—O-based semiconductors (ZnO), In—Zn—O-based semiconductors (IZO (registered trademark)), Zn—Ti—O-based semiconductors (ZTO), Cd—Ge—O-based semiconductors, Cd—Pb—O semiconductors, CdO (cadmium oxide), Mg—Zn—O-based semiconductors, In—Sn—Zn—O-based semiconductors (for example, In2O3-SnO2-ZnO), and In—Ga—Sn—O based semiconductors.

In this embodiment, the first thin film transistor 21 and the second thin film transistor 22 are each a thin film transistor made of an oxide semiconductor, but may be a thin film transistor made of amorphous silicon. Either p-type or n-type may be used. Furthermore, as a specific configuration, any configuration such as a staggered type, an inverted staggered type, a coplanar type, or an inverted coplanar type may be employed.

As the vertical organic light emitting transistor 20, the vertical organic light emitting transistors 20 described in Patent Documents 1 and 2 can also be employed.

Control Method

Finally, a display control method will be described. In this embodiment, as shown in FIG. 1, the light emitting units 10 are arranged in an array. A column in the vertical direction in FIG. 1 shares the data line 11 and the current supply line 12, and a column in the horizontal direction in FIG. 1 shares the first gate line 13 and the second gate line 14.

In the following description, on the premise of the above-described configuration, the light emitting units 10 to be corrected at a time will be described as a combination of a horizontal row in FIG. 1 sharing the first gate line 13 and the second gate line 14. However, the light emitting unit 10 to be corrected at a time may be corrected simultaneously by a plurality of combinations in the horizontal direction in FIG. 1 sharing the first gate line 13, or the single light emitting unit 10 may be corrected in order.

The brightness compensation method according to this embodiment is performed during an image update interval for displaying the next image from the displayed image while the display 1 is displaying an image. The following brightness compensation method may be performed at an arbitrary timing, may be performed when the power is turned on, or may be performed at certain time intervals from after the power is turned on. In the case when the brightness compensation method is performed when the power is just turned on, before the display 1 displays any image or video from any signal input, a standard brightness correction procedure can be performed, during which pixels under measurement in the display will light up, and a flicking or color shifting or rolling pattern will be observed on the display 1. This can be considered as the bootup sequence of the display, since it is done before any image or video from any signal input is displayed on display 1, minimum interruption of the display viewing experience will be experienced by audiences of the display.

FIG. 6 is a flowchart showing a brightness correction procedure of the display 1. As shown in FIG. 6, when the display 1 starts correction control from a state where normal image display is performed, the gate controller 15c of the controller 15 switches the second thin film transistor 22, connected to the vertical organic light emitting transistor 20 to be corrected, to the ON state and switches the second thin film transistor 22, connected to the vertical organic light emitting transistor 20 not to be corrected, to the OFF state (S1).

After step S1 is performed, the gate controller 15c of the controller 15 switches the first thin film transistor 21, connected to the vertical organic light emitting transistor 20 to be corrected, to the ON state and switches the first thin film transistor 21, connected to the vertical organic light emitting transistor 20 no to be corrected, to the OFF state (S2). The controller 15 thus performs control, so that no voltage is applied to the gate electrode of the vertical organic light emitting transistor 20 not to be corrected, and no current is supplied to the source electrode.

While control is performed as described above, a voltage for brightness inspection is applied to the data line 11 connected to the first thin film transistor 21 in the ON state or all the data lines 11 (S3). Thus, a current corresponding to the sum of the respective current values, obtained when the voltage for brightness inspection is applied to the vertical organic light emitting transistor 20 to be corrected, flows through the current supply line 12.

Thus, the current measurement portion 16 measures a current connected to the current supply line 12 connected to the second thin film transistor 22 in the ON state or all the current supply lines 12 (S4). At this time, ideally, when the voltage for brightness inspection is applied to the gate electrode of the second thin film transistor 22, a current value obtained by multiplying a value of a current flowing from the current supply line 12 toward the source electrode by the number of the vertical organic light emitting transistors 20 to be corrected is measured.

Specific examples of a method of measuring a current value include a method in which a current value is measured by an A/D converter, a method in which a resistor is disposed on the current supply line 12 and a voltage appearing across the resistor is compared to a desired voltage value, and a method in which a shunt path is provided, when a current corresponding to a predetermined current value is flowed through the current supply line 12, the current flowing through the shunt path without flowing through each vertical organic light emitting transistor is measured with an ammeter, and a difference between the measured current value and the predetermined supplied current value is measured.

The controller 15 acquires a current value (I1) for a voltage (Vc) for brightness inspection actually measured as the characteristic information by the data input/output circuit 15d, and stores the current value in the memory 17. At this time, the data input/output circuit 15d of the controller 15 reads a current value (I0) with respect to the voltage (Vc) for brightness inspection in a state just after manufacturing or at the time of factory shipment from the memory 17. Then, the arithmetic processing circuit 15e confirms deviation from the characteristic information, and determines a corrected value of the voltage applied to the data line 11 so that generated deviation ($\Delta I = I1 - I0$) of a current value is reduced (S5). The characteristic information used for comparison at this time may be conductance (gm1=I1/Vc) calculated by the arithmetic processing circuit 15e conductance.

When the corrected value is determined, the control returns to a normal image display control, the gate controller 15c of the controller 15 switches the second thin film transistor 22 to the ON state, and a corrected voltage which is a voltage corresponding to an image to be displayed by the gate driver 15a of the controller 15 is applied to the data line 11.

As described above, the corrected voltage value is applied to the gate electrode of the vertical organic light emitting transistor 20, so that even when, due to deterioration, an expected current does not flow through the source electrode with respect to the voltage applied to the gate electrode, control of the gate electrode is corrected so as to obtain an expected current value, and it is possible to suppress a change in brightness and compensate brightness for long-time lighting.

In the brightness compensation method of this embodiment, as described above, almost no current flows through the vertical organic light emitting transistor 20 not to be corrected. Accordingly, when correction control is performed at a time, in the light emitting unit 10, although only one horizontal row in FIG. 1 sharing the first gate line 13 and the second gate line 14 slightly emits light, the other vertical organic light emitting transistors 20 are turned off. Therefore, this is equivalent to a black screen insertion at the image update interval. Black screen insertion can be performed after every image-showing frame, that is, Black screen and image-showing screen alternate every other frame during the operation time of the display 1. Therefore, in each black screen insertion time, one horizontal row in FIG. 1 can go through the brightness measurement and compensation process, and all pixels in the display will be measured and compensated one row after another in a rolling fashion continuously. To minimize the impact of the display quality from the row being measured and compensated in the black screen insertion frame, the signal for the brightness of each pixels in that row can be adjusted to let that pixel emits a time average brightness equal to the target brightness of the pixel required by the display content. Due to black screen insertion, pixels in general need to be twice as bright during the image-showing frame to meet the time average brightness requirement. For example, if a pixel has a target brightness of 100 cd/m^2 required by the display content in the coming frames, the actual output brightness of this pixel needs to be 200 cd/m^2 during the image-showing frame, and this is because this pixel will not emit any light during the black screen insertion frame, so that the average brightness of this pixel during the image-showing frame and the black screen insertion frame is 100 cd/m^2. However, if a pixel in a row that will go through the measurement and compensation sequence during the next black screen insertion frame needs to light up to a target brightness of 100 cd/m^2 required by the display content, since this pixel will be emitting during the black screen insertion frame, the brightness of this pixel during the image-showing frame and the black screen insertion frame can be adjusted to give the target value, such as image-showing frame brightness:black screen insertion frame brightness=100 cd/m^2:100 cd/m^2, or 150 cd/m^2:50 cd/m^2, or 50 cd/m^2:150 cd/m^2, or 0 cd/m^2:200 cd/m^2, etc. Appropriate brightness value, and there for current value of the pixel can be used during the black screen insertion frame to suit the need to do more accurate and effective measurement and compensation.

When a black screen is inserted at the image update interval, in a liquid crystal display or a light emitting display, a screen different from an image displayed during an update interval of an image to be displayed is inserted for a moment, so that afterimages can be reduced when a previous image is switched to the next image. Thus, the display can display images and moving images more clearly by suppressing afterimages by the above method.

Another Embodiment

Hereinafter, another embodiment will be described.

<1> The corrected value may be determined based on the current value or conductance measured during the previous correction control stored in the memory 17. Based on the value measured during the previous correction control, the display 1 can also be used for correction of the corrected value according to the passage of time and detection of a defect.

<2> FIG. 7 is a schematic configuration diagram of a portion of another embodiment of the display 1. As shown in FIG. 7, the display 1 of the present invention may not include the second thin film transistor 22. The second thin film transistor 22 cuts off a current path so that no current flows through the vertical organic light emitting transistor 20 not to be corrected. By applying appropriate data signal voltage on the data line 11 and feed appropriate voltage to the gate electrode of the vertical organic light emitting transistor 20, the vertical organic light emitting transistor 20 can be turned to its off state, in which minimum current flows through the device. In other words, if in its off state the current flowing through the vertical organic light emitting transistor 20 not to be corrected is very small and is not so high a value as would affect correction calculation, the second thin film transistor 22 may not be needed.

With the above configuration, wiring and elements can be reduced, and the light emitting region can be further increased. Therefore, the display 1 with higher brightness can be achieved.

<3> The display 1 may be configured to emit light, emitted from the organic semiconductor layer 20a, to the opposite side of the substrate 30 and display an image. This configuration is also called a "top emission method", and has an advantage that an element can be configured between the vertical organic light emitting transistor 20 and the substrate 30.

<4> The configuration included in the display 1 described above is merely an example, and the present invention is not limited to the illustrated configurations.

The invention claimed is:

1. A method of compensating brightness of a display comprising a plurality of vertical organic light emitting transistors and a memory element that stores characteristic information about vertical organic light emitting transistor performance characteristics, the method comprising:
   a step (A) of applying a voltage for brightness inspection to a gate electrode of a vertical organic light emitting transistor to be corrected;
   a step (B) of measuring a current flowing through a current supply line through which the current is supplied to a source electrode of the vertical organic light emitting transistor by the application of the voltage for brightness inspection to the gate electrode of the vertical organic light emitting transistor to be corrected; and a step (C) of determining a corrected value of the voltage to be applied to the gate electrode of the vertical organic light emitting transistor based on a value of the current measured in the step (B) and the characteristic information of the vertical organic light emitting transistor stored in the memory element, wherein the step (A) comprises a step (A1) of cutting off supply of a current to vertical organic light emitting transistors not to be corrected.

2. The method of compensating brightness of a display according to claim 1, wherein the step (A) and the step (B) are performed during an image update interval.

3. The method of compensating brightness of a display according to claim 1, wherein the step (B) comprises a step (B1) of storing a value of the current, measured in the step (B), in the memory element.

4. A display comprising:
a plurality of vertical organic light emitting transistors;
a data line that supplies a voltage for controlling a gate electrode of the plurality of vertical organic light emitting transistors;
a current supply line that supplies a current to a source electrode of the plurality of vertical organic light emitting transistors;
a first thin film transistor that is connected between the gate electrode of each of the plurality of vertical organic light emitting transistors and the data line and controls voltage supply to the gate electrode of the vertical organic light emitting transistor;
a first gate line that is connected to a gate electrode of the first thin film transistor and controls the first thin film transistor;
a controller that controls a voltage applied to at least the first gate line;
a current measurement portion that measures a current flowing through the current supply line;
a memory that stores characteristic information of each of the plurality of vertical organic light emitting transistors; and
a second thin film transistor that is connected between the source electrode of the vertical organic light emitting transistor and the current supply line and controls current supply to the source electrode of the vertical organic light emitting transistor,
wherein the controller performs control such that a voltage for brightness inspection is applied to the gate electrode of a vertical organic light emitting transistor to be corrected, and the second thin film transistor connected to vertical organic light emitting transistors that are not to be corrected is in an OFF state, the current measurement portion measures a current flowing through the source electrode of the vertical organic light emitting transistor by the application of the voltage for brightness inspection to the gate electrode of the vertical organic light emitting transistor to be corrected, and stores a value of the measured current in the memory, and the controller determines a corrected value of the voltage to be applied to the gate electrode of the vertical organic light emitting transistor based on the value of the measured current and the characteristic information of the vertical organic light emitting transistor stored in the memory.

5. The display according to claim 4, wherein a dielectric layer is formed between the gate electrode and the source electrode of the vertical organic light emitting transistor.

6. The display according to claim 5, wherein in the vertical organic light emitting transistor, at least one selected from the source electrode and the drain electrode comprises a conductive material containing carbon.

7. The display according to claim 6, wherein in the vertical organic light emitting transistor, at least one selected from the source electrode and the drain electrode comprises a carbon nanotube or graphene.

8. The display according to claim 4, wherein in the vertical organic light emitting transistor, at least one selected from the source electrode and the drain electrode comprises a conductive material containing carbon.

9. The display according to claim 8, wherein in the vertical organic light emitting transistor, at least one selected from the source electrode and the drain electrode comprises a carbon nanotube or graphene.

10. The display according to claim 4, wherein a set of second thin film transistors in a column operate in a sequence that allows current to flow through only one vertical light emitting transistor in the column at a time.

11. The display according to claim 10, wherein the current flowing through the current supply line through a single second thin film transistor into a single vertical light emitting transistor is measured by a measurement circuit on a periphery of a panel.

12. The display according to claim 4, wherein the second thin film transistor comprises an oxide semiconductor.

13. The display according to claim 4, wherein the second thin film transistor comprises an amorphous silicon semiconductor.

* * * * *